United States Patent
Toosi et al.

(10) Patent No.: US 10,333,636 B2
(45) Date of Patent: Jun. 25, 2019

(54) TOTAL SPECTRUM RECEPTION FOR UPSTREAM MONITORING

(71) Applicant: SiTune Corporation, San Jose, CA (US)

(72) Inventors: Vahid Mesgarpour Toosi, San Jose, CA (US); Marzieh Veyseh, Los Altos, CA (US); Mehdi Khoshgard, Los Gatos, CA (US); Saeid Mehrmanesh, Los Altos, CA (US)

(73) Assignee: SiTune Corporation, San Jose, CA (US)

( * ) Notice: Subject to any disclaimer, the term of this patent is extended or adjusted under 35 U.S.C. 154(b) by 55 days.

(21) Appl. No.: 15/659,973

(22) Filed: Jul. 26, 2017

(65) Prior Publication Data
US 2019/0036627 A1 Jan. 31, 2019

(51) Int. Cl.
| | |
|---|---|
| *H03D 3/00* | (2006.01) |
| *H04B 1/403* | (2015.01) |
| *H04W 24/08* | (2009.01) |
| *H04B 17/309* | (2015.01) |

(52) U.S. Cl.
CPC .......... *H04B 17/309* (2015.01); *H03D 3/006* (2013.01); *H04B 1/406* (2013.01); *H04W 24/08* (2013.01)

(58) Field of Classification Search
CPC ...... H04B 17/309; H04B 1/406; H03D 3/006; H04W 24/08
See application file for complete search history.

(56) References Cited

U.S. PATENT DOCUMENTS

| | | | | |
|---|---|---|---|---|
| 5,953,670 | A * | 9/1999 | Newson | H04W 88/085 370/466 |
| 6,453,472 | B1 * | 9/2002 | Leano | H04L 1/0001 348/E7.07 |
| 2003/0012271 | A1 * | 1/2003 | McReynolds | H04L 5/143 375/219 |
| 2004/0190544 | A1 * | 9/2004 | Azenko | H04L 12/2801 370/442 |
| 2007/0133425 | A1 * | 6/2007 | Chappell | H04L 43/00 370/250 |
| 2008/0298270 | A1 * | 12/2008 | Chappell | H04L 12/2801 370/252 |
| 2012/0213259 | A1 * | 8/2012 | Renken | H04N 7/17309 375/222 |
| 2014/0010269 | A1 * | 1/2014 | Ling | H04B 3/00 375/222 |

* cited by examiner

*Primary Examiner* — Kashif Siddiqui
(74) *Attorney, Agent, or Firm* — Hogan Lovells US LLP

(57) ABSTRACT

The present disclosure relates to methods and systems for monitoring upstream signals and for providing the total bandwidth to a base station for analysis of any disruptions. In an example, the present methods and systems include at least a first circuit and a second circuit. The first circuit is coupled to a cable input-output port. The first circuit is configured for providing upstream signals from broadband signals of the upstream feed. The second circuit is configured for processing the upstream signals by adjusting its dynamic range to provide processed signals with an adjusted dynamic range. The second circuit is also configured for analyzing a spectrum of the processed signals and for providing information characterizing the processed signals to a processor of a modem.

22 Claims, 3 Drawing Sheets

TOTAL SPECTRUM RECEPTION FOR UPSTREAM MONITORING

TECHNICAL FIELD

The present disclosure generally relates to modem technology and to monitoring and capturing total signal spectrums in data communications using novel integrated circuits at the subscriber end of a communications network.

BACKGROUND

A network for communications, including for cable television, phone, and internet data traffic, typically includes a base station, one or more head-ends, one or more intermediate hubs, and the subscriber facilities. The subscriber facilities typically represent the end of the line and include one or more modems, routers, and the consuming technology—phones, televisions, computers, laptops, electronic tablets, smartphones, InternetOfThings (IoT) devices, and other internet-enabled devices.

Any incident causing disruption in service at the subscriber facilities typically requires an in-person review of the cause. In various embodiments, disruption in service can include, for example, abnormality in the upstream feed compared to, for example, a perfect signal. For example, a disruption for review includes poor signal quality, interference, loss of data or signals, and other related disruptions. A service provider of the services on the communications network or an agent or owner of the communications network is typically responsible for the review and subsequent rectification of the disruption. An in-person review is time consuming, expensive, and inefficient.

SUMMARY

The present disclosure resolves deficiencies in typical processes for reviewing and subsequent rectification of a disruption in a communications network. Pertinently, the present disclosure monitors signal spectrums in data communications using novel integrated circuits at the subsriber end of a communications network In an exemplary implementation, the present disclosure includes at least a first circuit and a second circuit. The first circuit is coupled to a cable input-output port. The first circuit is configured for communicating broadband signals of an upstream feed. The first circuit provides upstream signals from the broadband signals. The second circuit is configured for adjusting a dynamic range of the upstream signals to provide processed signals with an adjusted dynamic range. The second circuit is also configured for providing information characterizing the processed signals to a processor of a modem.

In another exemplary implementation, the present disclosure includes a method with a function for communicating broadband signals in a first circuit that is coupled to an upstream feed of a cable input-output port. The method includes providing, via the first circuit, upstream signals from the broadband signals. A processing function of the method, in the second circuit, adjusts a dynamic range of the upstream signals to provide processed signals of an adjusted dynamic range. Analyzing is performed in the second circuit that is in communication with the first circuit. The analyzing function analyzes a spectrum of the processed signals to provide information characterizing the processed signals to a processor of a modem.

BRIEF DESCRIPTION OF THE DRAWINGS

The accompanying drawings constitute a part of this specification and, together with the specification, illustrate certain exemplary implementations of this disclosure.

DETAILED DESCRIPTION

Systems and methods in accordance with various embodiments of the present disclosure may overcome one or more of the aforementioned and other deficiencies experienced in conventional approaches to review and subsequently rectify a disruption in a communications network. Embodiments herein provide a method for integrated circuit implementation, and that monitors upstream feed and provides information characterizing processed signals associated with the upstream signals in the upstream feed from a modem to a base station. Pertinently, the disclosure herein configures a system to monitor and capture a full or total spectrum, and to transmit information pertaining to disruption of the full or total spectrum for analysis at the base station. In an example, a first circuit, which is in communication with a cable input-output port. is configured for communicating broadband signals from the upstream feed. The method includes using a low pass filter for providing upstream signals from the broadband signals. In an embodiment, the upstream signals may be formatted as differential input signals. A processing function of the method, in a second circuit, processes the upstream signals at a predetermined dynamic range to provide processed signals. For example, the processing function is an adjusting function to adjusting a dynamic range of the upstream signals to provide processed signals with an adjusted dynamic range. Analysis is performed in the second circuit that is in communication with the first circuit. The analysis is to a spectrum of the processed signals and to provide information characterizing the processed signals, from the second integrated circuit to a processor of a modem.

Various other functions and advantages are described and suggested below as may be provided in accordance with the various embodiments.

Figure 1:
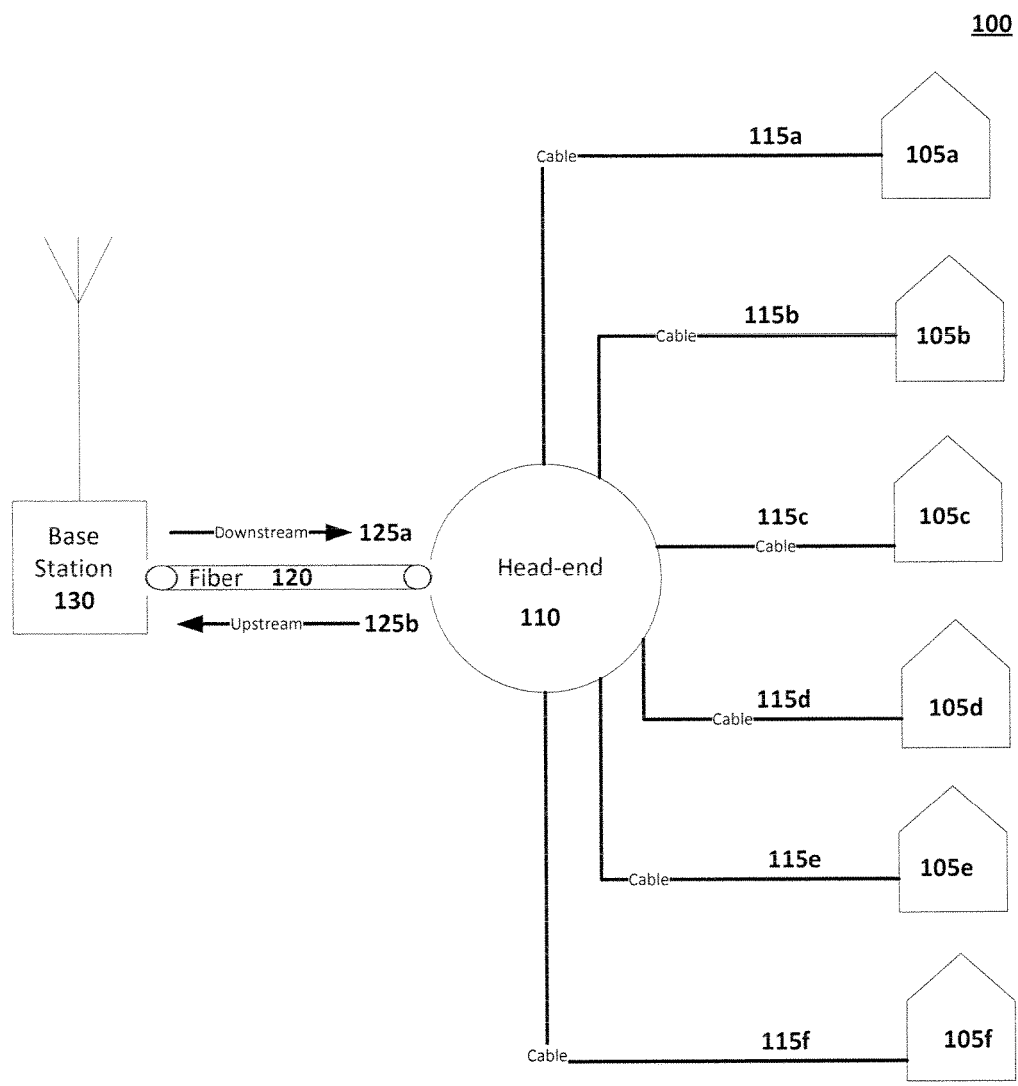
FIG. 1 illustrates an exemplary communications network in accordance with various embodiments.

FIG. 1 illustrates an exemplary communications network 100 in accordance with various embodiments. The communications network 100 includes at least a base station 130, a head-end 110, and subscriber facilities 105*a-f*. The base station 130 is typically in communication with the head-end via fiber 120, although other communication systems, including physical and virtual (e.g., wired and wireless) systems may connect the base station 130 to the head-end 110. The head-end is in communication with the subscriber facilities 105 via cable 115*a-f*, although other communication systems, including fiber (similar to the base station's connection with the head-end), or other physical and virtual (e.g., wired and wireless) systems may connect the head-end 110 to the subscriber facilities 105. The communications network 100 supports upstream and downstream traffic via both the fiber 125—where the traffic is illustrated as element numeric 125a-b, and the cable 115.

The subscriber facilities 105 include modems and, optionally, routers, both of which may be wired or wireless type devices. The upstream and downstream signals from cable 115 transmit digital signals carrying data for voice, telephony, television, and other services, over radio frequency (RF) carrier signals to the modem. In a two-way communication network, one or more carrier signals are designated to transmit data in the downstream direction, from the head-end to the modem at a subscriber facility 105, while other carrier signals are designated to transmit data in the upstream direction, from the subscriber facility 105 to upstream components in the communications network 100, e.g., the head-end 110, and subsequently, the base station 130. The modems at each subscriber facility 105 convert the data as required for the upstream or downstream transmission—for e.g., from a digital format to a RF modulated signals in the upstream direction into the communications network 100, and from RF signals to digital format for the downstream direction consuming devices. A cable modem termination system (CMTS) performs the opposite operation for multiple subscribers at the cable operator's head-end.

The downstream and upstream transmissions can occur in, for example, a 6 MHz bandwidth channel. As described above, the downstream portion is designated to a predetermined portion of the available bandwidth, with the upstream portion designated to the remainder. Moreover, subscriber facilities that are condominium-styled facilities are designated to share bandwidth from singular cables, in some instances. Accordingly, monitoring the entire spectrum, as well as, transmission characteristics of the entire spectrum is beneficial for review and subsequent rectification of any disruption in a communications network without an in-person intervention.

Figure 2:
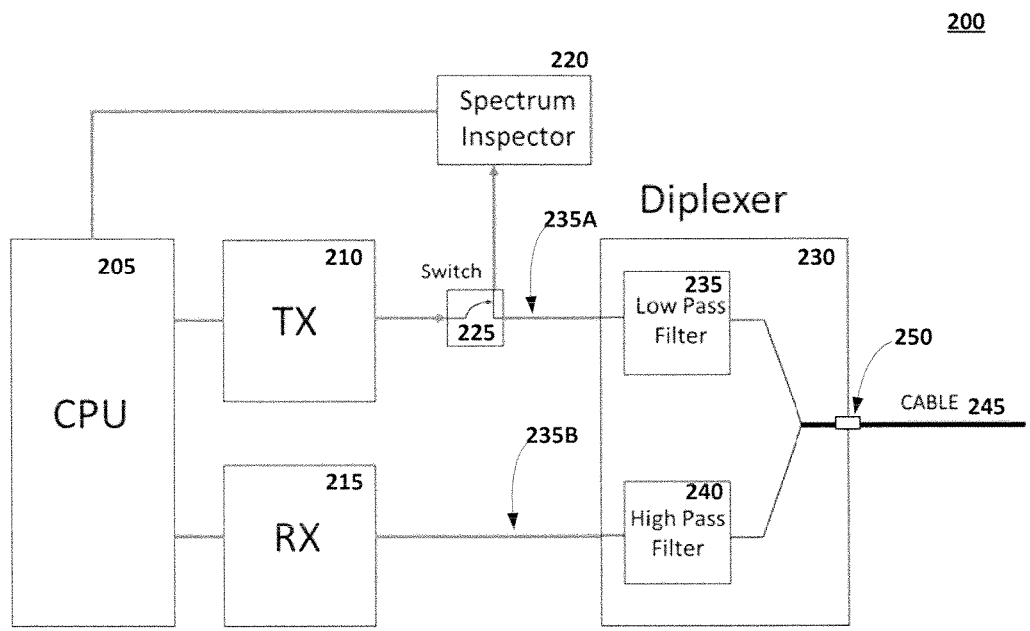
FIG. 2 illustrates, in a block diagram, an exemplary modem printed circuit board (PCB) implementation in accordance with various embodiments.
Figure 3:
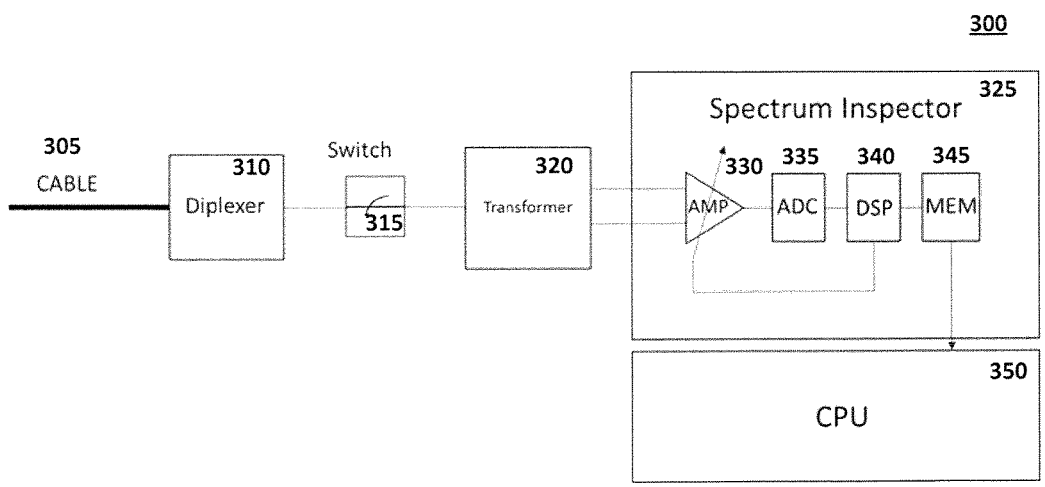
FIG. 3 illustrates block diagram components at a subscriber facility for performing the present disclosure, in accordance with various embodiments.

FIG. 2, in conjunction with FIG. 3, illustrates exemplary block diagram components 200/300 at a subscriber facility for performing the present disclosure, in accordance with various embodiments. Pertinently, the example in FIGS. 2 and 3 illustrates block diagrams of a modem printed circuit board (PCB) system 200/300 with integrated circuits 205-235/310-350 as further exemplary components that connect to a consuming technology in one of subscriber facilities 105. In an example, the integrated circuits 205-235/310-350 may, together or individually, form one or more of semiconductor die or chips that are either implemented from wafer-scale integration (WFI), system-on-a-chip (SOC), or three dimensional integrated circuit (3D-IC) processes. The one or more semiconductor chips include multi-core chips, multi-chip packages, stacked die packages, and multi-die packages. The modem PCB system 200, for instance, connects to the consuming technology (e.g., phones, televisions, computers, laptops, electronic tablets, smartphones, InternetOfThings (IoT) devices, and other internet-enabled devices) to convert signals from the upstream cable to the downstream consuming technology, and from the downstream consuming technology to the upstream cable. The signals on the upstream and downstream directions are routed through cable 245/305 extending out of the modem PCB system 200/300.

Exemplary system 200/300 includes one or more of a first circuit 205/310, a second circuit 220/325, a cable input-output port 250, and other auxiliary components or sub-components, such as amplifiers 330, inductors, transformers 320, switches 315, and splitters. In an example, the cable input-output port 250 includes a digital subscriber line (DSL) port, and registered jack 45 (RJ45) data and network port, F-connector (RF/COAX) port, and Ethernet 8P8C port. The cable input-output port 250 is coupled to a cable 245 from the head-end 110 or an intervening component, such as a hub or a cable signal splitter. The cable input-output port 250 is coupled to a diplexer 230. The diplexer 230 implements a frequency domain multiplexing to provide upstream and downstream signals from the input signals of the cable 245, and without interferences between the signals. For example, using low pass filter 235 and high pass filter 240, the output of the diplexer is the downstream signals (received signals) on a downstream line 235B and the upstream signals (transmitted signals) on the upstream line 235A. The upstream signals are optionally switched via signal tap 225, such as a switch, which intercepts or switches the upstream signals on the upstream line 235A and provides the upstream signals to a second circuit 220. In an implementation, the first circuit may include a transformer that generates or causes differentially formatted versions of the upstream signals from the input signals, thereby disallowing effects of electromagnetic interference or noise from distorting the signal. It is possible that a signal splitter is used in the same manner as the transformer to generate the upstream signals from the input signals.

FIG. 2 also illustrates aspects of the present disclosure featuring a diplexer 230, which comprises a low pass filter 235 to separate the upstream signal and a high pass filter 240 to separate the downstream signal from the input signal on cable 245 as explained above. The present disclosure also features a switch 225 that connects the transmitter circuit 210 to the low pass filter 235 in order to intercept the upstream signals from the diplexer 230. The switch 225 also connects the low pass filter 235 to the spectrum analyzer circuit 220, which performs the functions of analyzing the quality of the upstream network, using the spectrum of the upstream signals, to detect any possible reason for disruption of service such as interference by providing information characterizing the spectrum.

The second circuit 220 is configured for processing upstream signals at a predetermined dynamic range or to adjust the dynamic range of the upstream signals by extracting information characterizing the upstream signals. In conjunction with the circuit block diagram of FIG. 3, the second circuit 220 and its circuit interactions as detailed herein. For example, the second circuit 220 includes a linear operational amplifier (op amp) 330 coupled to an analog-to-digital converter (ADC) 335 and a digital signal processor (DSP) 340 to form an automatic gain control loop (AGC). The DSP 340 is also coupled to memory 345 to buffer the extracted data or information, from the upstream signals, prior to passing to the cable silicon-on-chip (SOC) integrated circuit—illustrated as the processor or central processing unit (CPU) 205/350. The CPU 205/350 drives the upstream feed. The AGC of the spectrum analyzer 325 is a closed-loop system for regulating amplitude output from the upstream signals. The liner op amp 330 is configured as a high dynamic range amplifier and balances an inherent feature of an AGC to compress the dynamic range. As a result, the AGC, using the linear op amp 330, captures a high dynamic range of the differential input signals. The ADC 335 is a wide band analog-to-digital converter and also functions to retain the high dynamic range of the differential input signals. Further, the DSP 340 is designed using field effect transistors (FET) to maintain discrete features of the digital signal from the ADC 335.

The second circuit 220 is in communication with the first circuit 230 and is configured for integrating the characterizing data or information buffered in memory 345 into subsequent upstream signals for analysis at a base station 130. For example, the extracted data is treated as part of subsequent upstream signals for the upstream feed into the cable input-output port 250, which then transmits the subsequent upstream signals to the head-end 110. The head-end 110 transmits the subsequent upstream signals to the base station 130 for analysis to review any disruption in a communications network—including poor signal quality, interference, loss of data or signals, and other related disruptions. Rectification of the identified disruption is sometimes possible by resetting components remotely or by in-person repair.

Figure 4:
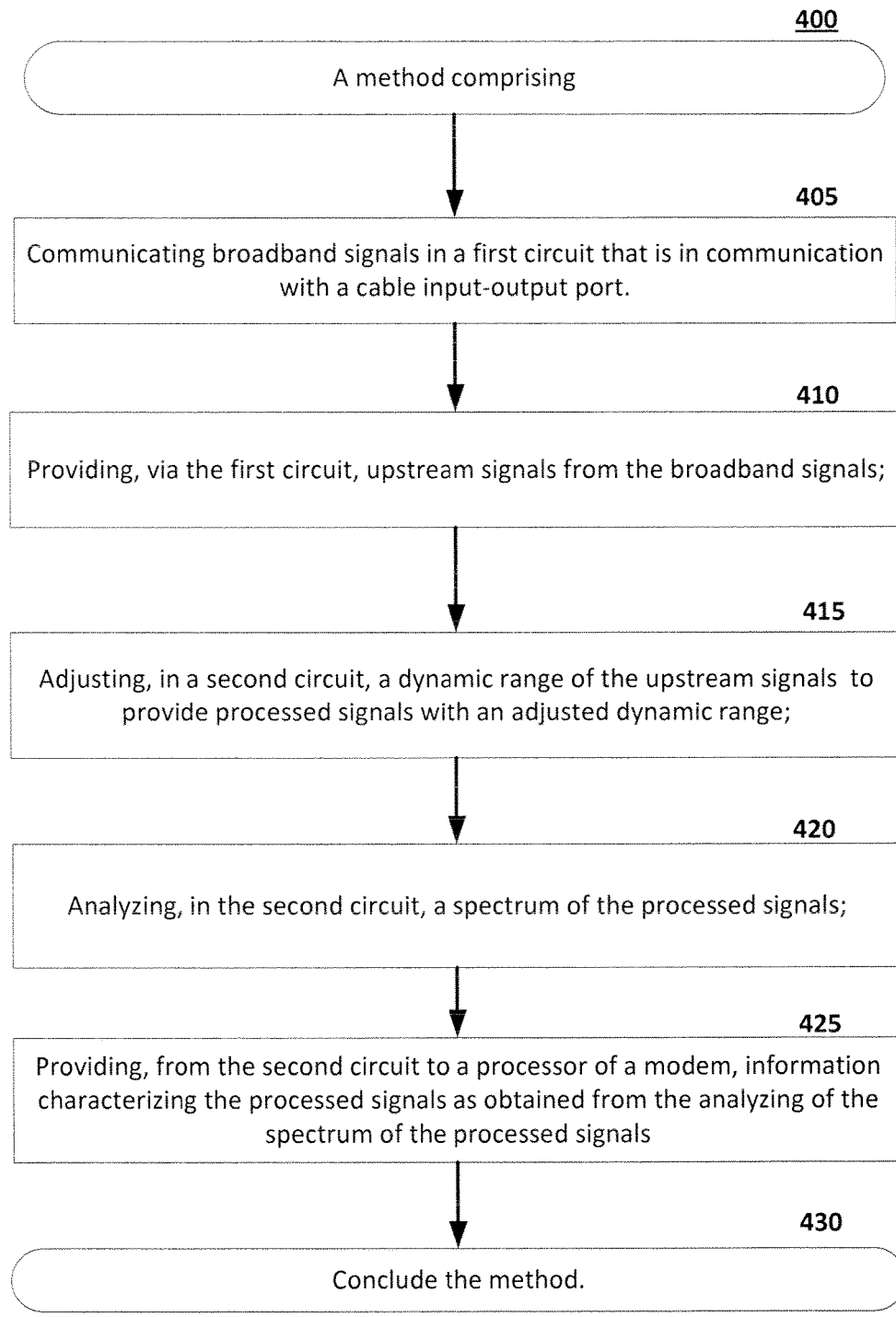
FIG. 4 is a flow chart illustrating an algorithm for software or firmware that performs the present disclosure using the components at a subscriber facility, in accordance with various embodiments.

FIG. 4 is a flow chart illustrating an algorithm for software or firmware 400 that performs the present disclosure using the components 200/300 at a subscriber facility, in accordance with various embodiments. The method 400 of the present disclosure includes a communication function 405 for communicating broadband signals, in a first integrated circuit that is in communication with a cable input-output port. The method includes a function 410 for providing, via the first circuit, upstream signals from the broadband signals. A processing function 415, via a second circuit—such as the spectrum analyzer circuit of FIGS. 2/3—processes the upstream signals at a predetermined dynamic range to provide processed signals. For example, processing function 415 is an adjusting function, via a second circuit—such as the spectrum analyzer circuit of FIGS. 2/3—that adjusts a dynamic range of the upstream signals at to provide processed signals with an adjusted dynamic range. The adjustment to the dynamic range may be by a predetermined value or function. Analyzing function of block 420 performs an analysis of a spectrum of the processed signals in a second circuit that is in communication with the first integrated circuit. Function 425 provides, from the second circuit to a processor of a modem, information characterizing the processed signals as obtained from the analyzing block 420. Block 430 concludes the method 400 of the present disclosure. After the conclusion, the head-end 110 transmits the subsequent upstream signals to the base station 130 for analysis to review any disruption in a communications network—including poor signal quality, interference, loss of data or signals, and other related disruptions for the upstream signals. Rectification of the identified disruption is sometimes possible by resetting components remotely or by in-person repair.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to monitor upstream signals in an upstream feed and to provide the spectrum to the base station for analysis.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system comprising:
a first circuit in communication with a cable input-output port, the first circuit configured for communicating broadband signals;
a signal tap for intercepting the broadband signals and providing the broadband signals to a second circuit for analysis so that the broadband signals are unavailable to the input-output port;
a second circuit configured for adjusting a dynamic range of upstream signals from the broadband signals and to provide processed signals of an adjusted dynamic range; and
the second circuit configured for analyzing a spectrum of the processed signals and for providing information characterizing the processed signals to a processor of a modem.

2. The system of claim 1, wherein the second circuit further comprises: an automatic gain control (AGC) loop in communication with an analog-to-digital converter (ADC), a digital signal processor (DSP) and a memory.

3. The system of claim 2, wherein the AGC is a variable gain amplifier that receives feedback from the digital signal processor (DSP).

4. The system of claim 2, wherein the ADC is a wideband analog-to-digital converter.

5. The system of claim 1, wherein the first circuit comprises a low pass filter as a component in an optional diplexer, the low pass filter for separating the upstream signals from the broadband signals.

6. The system of claim 1, further comprising a switch as the signal tap, the switch communicating the broadband signals to the second circuit instead of the input-output port.

7. The system of claim 1, wherein the first and the second circuits are part of a single microprocessor chip.

8. The system of claim 1, wherein the second circuit comprises a channel tuner and a digital-to-analog converter (DAC).

9. The system of claim 1, further comprising a signal tap that is in communication with the first circuit and a programmable gain amplifier (PGA), the signal tap for intercepting the upstream signals and for providing upstream signals for the processing in the second circuit.

10. The system of claim 1, wherein the first and the second circuits are installed in a device comprising the cable input-output port for performing functions in a communications network.

11. The system of claim 1, further comprising a transformer, a switch, or a signal splitter for splitting the upstream signals from the broadband signals.

12. A method comprising:
communicating broadband signals in a first circuit that is in communication with a cable input-output port;
intercepting the broadband signals using a signal tap so that the broadband signals are unavailable to the input-output port;
providing the broadband signals to a second circuit for analysis;
adjusting, in a second circuit a dynamic range of upstream signals obtained from the broadband signals, the adjusting to provide processed signals with an adjusted dynamic range;
analyzing, in the second circuit, a spectrum of the processed signals; and
providing, from the second circuit to a processor of a modem, information characterizing the processed signals as obtained from the analyzing of the spectrum of the processed signals.

13. The method of claim 12, wherein the second circuit further comprises an automatic gain control (AGC) loop in communication with an analog-to-digital converter (ADC), a digital signal processor (DSP) and a memory.

14. The method of claim 13, wherein the AGC is a variable gain amplifier that receives feedback from the digital signal processor (DSP).

15. The method of claim 13, wherein the ADC is a wideband analog-to-digital converter.

16. The method of claim 12, wherein the first circuit comprises a low pass filter as a component in an optional diplexer, the low pass filter for separating the upstream signals from the broadband signals.

17. The method of claim 12, further comprising performing the interception using a switch as the signal tap to communicate the broadband signals to the second circuit instead of the input-output port.

18. The method of claim 12, wherein the processing and the analyzing are performed in the first and the second circuits that are part of a single microprocessor chip.

19. The method of claim 12, further comprising providing, by a digital-to-analog converter (DAC) that is in communication with a channel tuner, the upstream signals for analysis of the spectrum of the processed signals.

20. The method of claim 19, further comprising:
intercepting, via a signal tap that is in communication with the first circuit and a programmable gain amplifier (PGA), the upstream signals; and
providing the upstream signals for the processing in the second circuit.

21. The method of claim 12, wherein the processing and the analyzing are performed in the first and the second circuits that are part of a device performing functions in a communications network.

22. The method of claim 12, further comprising providing the upstream signals from the broadband signals using a transformer, a switch, or a signal splitter, prior to the processing in the second circuit.

* * * * *